(12) United States Patent
Arai et al.

(10) Patent No.: US 7,692,899 B2
(45) Date of Patent: *Apr. 6, 2010

(54) HEAD SUSPENSION HAVING WIRING DISPOSED IN CONTACT WITH SLIGHTLY CONDUCTIVE FLEXIBLE RESIN

(75) Inventors: Hajime Arai, Kanagawa (JP); Ikuo Someya, Kanagawa (JP); Ryuichi Kawatake, Kanagawa (JP); Tsukasa Higashi, Kanagawa (JP)

(73) Assignee: NHK Spring Co., Ltd., Yokohama (JP)

( * ) Notice: Subject to any disclaimer, the term of this patent is extended or adjusted under 35 U.S.C. 154(b) by 334 days.

This patent is subject to a terminal disclaimer.

(21) Appl. No.: 11/359,981

(22) Filed: Feb. 21, 2006

(65) Prior Publication Data

US 2006/0190673 A1 Aug. 24, 2006

(30) Foreign Application Priority Data

Feb. 21, 2005 (JP) ............................. 2005-044753
Jun. 29, 2005 (JP) ............................. 2005-189800

(51) Int. Cl.
*G11B 21/16* (2006.01)
*G11B 5/48* (2006.01)

(52) U.S. Cl. ................................ 360/244.3; 360/245.8

(58) Field of Classification Search ........ 360/245–245.9, 360/244, 244.1, 244.2, 244.3, 244.4, 244.5, 360/244.6, 244.7, 244.8, 244.9

See application file for complete search history.

(56) References Cited

U.S. PATENT DOCUMENTS 5,612,840 A * 3/1997 Hiraoka et al. ........... 360/245.9

| | | | | |
|---|---|---|---|---|
| 5,644,454 A * | 7/1997 | Arya et al. | ............... | 360/245.8 |
| 5,657,186 A * | 8/1997 | Kudo et al. | ............... | 360/234.5 |
| 5,710,682 A * | 1/1998 | Arya et al. | ............... | 360/245.8 |
| 5,805,382 A * | 9/1998 | Lee et al. | ............... | 360/244.1 |
| 6,459,043 B1 * | 10/2002 | Dodsworth | ............... | 174/254 |
| 6,487,048 B1 * | 11/2002 | Dunn | ............... | 360/245.9 |

(Continued)

FOREIGN PATENT DOCUMENTS

CN 1497536 5/2004

(Continued)

OTHER PUBLICATIONS

Jan. 31, 2003 ESD assessment of GMR head Shoji Natori IDEMA Japan News 54.

(Continued)

*Primary Examiner*—Craig A. Renner
(74) *Attorney, Agent, or Firm*—Jordan and Hamburg LLP

(57) ABSTRACT

A head suspension prevents a read element from electrostatic discharge damage without employing a static electricity remover or without increasing the number of manufacturing processes. The head suspension has a load beam to apply load to a head that writes and reads data to and from a hard disk, a flexure made of a conductive thin substrate attached to the load beam and supporting the head, an insulating base layer made of flexible resin and formed on the substrate of the flexure, write wires and read wires connected to the head and formed on the insulating base layer, and an insulating cover layer covering the write and read wires on the insulating base layer. The insulating cover layer is made of slightly conductive flexible resin.

14 Claims, 8 Drawing Sheets

U.S. PATENT DOCUMENTS

| | | | |
|---|---|---|---|
| 6,700,748 B1 * | 3/2004 | Cowles et al. | 360/245.9 |
| 6,775,101 B2 * | 8/2004 | Satoh et al. | 360/234.6 |
| 6,801,402 B1 * | 10/2004 | Subrahmanyam et al. | 360/245.9 |
| 6,942,824 B1 * | 9/2005 | Li | 252/512 |
| 6,947,258 B1 * | 9/2005 | Li | 360/234.6 |
| 7,031,114 B2 * | 4/2006 | Wu et al. | 360/234.6 |
| 7,095,590 B2 | 8/2006 | Motonishi et al. | |
| 7,193,818 B2 * | 3/2007 | Sato et al. | 360/234.6 |
| 2002/0154454 A1 * | 10/2002 | Kupinski et al. | 360/245.9 |
| 2003/0002220 A1 | 1/2003 | Nojima | |
| 2003/0062194 A1 * | 4/2003 | Dodsworth et al. | 174/256 |
| 2003/0151902 A1 * | 8/2003 | Kageyama et al. | 361/749 |
| 2005/0117257 A1 * | 6/2005 | Thaveeprungsriporn et al. | 360/246 |
| 2006/0187587 A1 * | 8/2006 | Arai et al. | 360/245.9 |
| 2006/0190673 A1 | 8/2006 | Arai et al. | |

FOREIGN PATENT DOCUMENTS

| | | |
|---|---|---|
| CN | ZL 02122683.0 | 12/2005 |
| JP | 9-282624 | 10/1997 |
| JP | 10-198935 | 7/1998 |
| JP | 2001-291215 | 10/2001 |
| JP | 2003-6828 | 1/2003 |
| JP | 2003124581 A * | 4/2003 |
| JP | 2003-203436 | 7/2003 |
| JP | 2004-192672 | 7/2004 |

OTHER PUBLICATIONS

Jan. 31, 2003 ESD assessment of GMR head Shoji Natori IDEMA Japan News vol. 54 pp. 1-5.

* cited by examiner

HEAD SUSPENSION HAVING WIRING DISPOSED IN CONTACT WITH SLIGHTLY CONDUCTIVE FLEXIBLE RESIN

BACKGROUND OF THE INVENTION

1. Field of the Invention

The present invention relates to a head suspension for a hard disk drive installed in an information processing apparatus such as a computer.

2. Description of Related Art

A hard disk drive (HDD) employs a head suspension for suspending a magnetic head to write and read data to and from a magnetic disk. To transfer write and read signals to and from the magnetic head, wires are connected to the magnetic head. The wires are arranged on an insulating base layer that is made of flexible resin and is formed on a flexure. The flexure is a part of the head suspension and is made of a resilient stainless-steel thin plate. The wires are covered with an insulating cover layer made of flexible resin.

When the flexure is assembled into the head suspension, the surface of the insulating cover layer may be rubbed with another part such as a clamp or a tool, to accumulate static electricity. This static electricity is transferred to the wires under the insulating cover layer. If the magnetic head of the head suspension touches a tool or a jig, the static electricity accumulated in the wires will move to the magnetic head to deteriorate or destroy a read element of the magnetic head.

Recent hard disk drives employ highly sensitive read elements such as MR (magnetoresistive) elements, GMR (giant magnetoresistive) elements, and TuMR (tunneling magnetoresistive) elements. These elements are vulnerable to static electricity and require an electrostatic discharge (ESD) damage preventive measure.

One measure for preventing the electrostatic discharge damage is to employ an ionizer (static electricity remover). The ionizer needs specific facilities and an additional process, to thereby increase costs, as disclosed in Japanese Unexamined Patent Application Publication No. 9-282624 and in Shoji Natori (Hitachi Computer Equipment) "ESD assessment of GMR head," Jan. 31, 2003, Technical Committee, ESD Control Group.

SUMMARY OF THE INVENTION

An object of the present invention is to provide a head suspension capable of preventing electrostatic discharge damage of a read element without a static electricity remover that may cause a cost increase.

In order to accomplish the object, an aspect of the present invention provides a head suspension having read wires at least which are coated with an insulating base or cover layer made of slightly conductive flexible resin.

According to this aspect, the insulating base or cover layer at least for read wires is made of slightly conductive flexible resin. Static electricity accumulated in the read wires can be discharged through the insulating base or cover layer to a flexure of the head suspension, or can be discharged from the insulating cover layer to the atmosphere. This results in preventing electrostatic discharge through a read element of a head, to thereby preventing an electrostatic destruction of the read element. Forming the insulating base or cover layer from slightly conductive flexible resin involves no additional process and no cost increase and is easy to carry out.

DETAILED DESCRIPTION OF EMBODIMENTS

Head suspensions according to various embodiments of the present invention will be explained. These embodiments form insulating base and/or cover layers from slightly conductive flexible resin, to prevent electrostatic discharge damage of a read element of a magnetic head without employing a static electricity remover and/or without increasing the number of manufacturing processes.

First Embodiment

[General Structure of Head Suspension]

Figure 1:
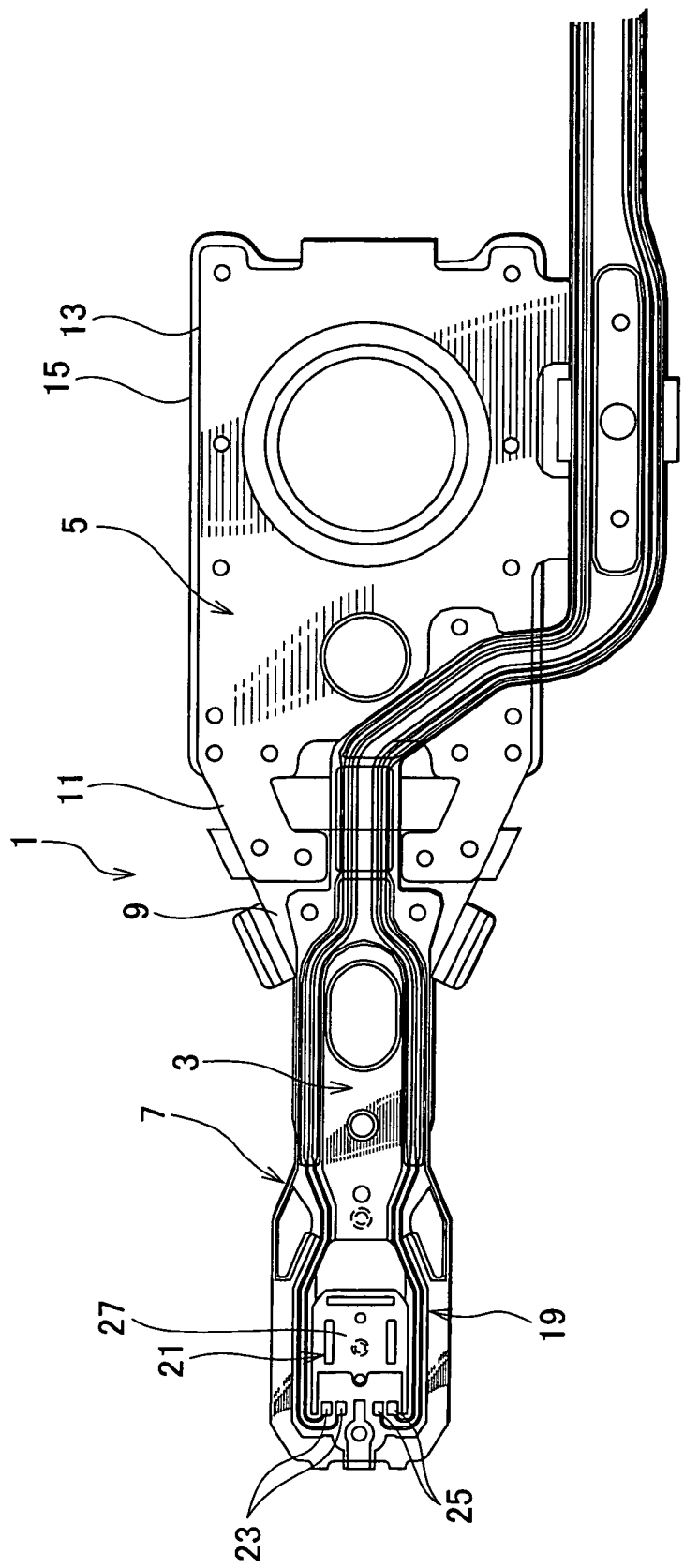
FIG. 1 is a plan view showing a head suspension according to a first embodiment of the present invention.

FIG. 1 is a plan view showing a head suspension according to a first embodiment of the present invention.

In FIG. 1, the head suspension 1 has a load beam 3, a base 5, and a flexure 7.

The load beam 3 includes a rigid part 9 and a resilient part 11, to apply load to a head 21. The rigid part 9 is made of, for example, stainless steel and is relatively thick. The thickness of the rigid part 9 is, for example, about 100 µm.

The resilient part 11 is a separate part from the rigid part 9 and is made of, for example, a resilient thin stainless-steel rolled plate. The spring constant of the resilient part 11 is precise and is lower than that of the rigid part 9. The thickness of the resilient part 11 is, for example, about 40 µm. A front end of the resilient part 11 is fixed to a rear end of the rigid part 9 by, for example, laser welding. A rear end of the resilient part 11 is integral with a reinforcing plate 13.

The base 5 has a base plate 15, which is laid over and fixed to the reinforcing plate 13 by, for example, laser welding. The base plate 15 is strengthened with the reinforcing plate 13, to form the base 5. The base 5 is attached to an arm of a carriage and is turned around a spindle.

The flexure 7 has a substrate 18 made of, for example, a resilient thin stainless-steel rolled plate (SST) having a thickness of about 30 µm. On the substrate 18, there is an electric insulating layer (to be explained later) on which wiring patterns 19 are formed. The flexure 7 is fixed to the rigid part 9 by, for example, laser welding. One ends of the wiring patterns 19 are electrically connected to write terminals 23 and read terminals 25 of the head 21. The other ends of the wiring patterns 19 are extended along the base 5.

The flexure 7 has a cantilever tongue 27 supported with the head 21. The tongue 27 has a write and read slider. The slider has terminals that correspond to the write terminals 23 and are connected to a write element. The slider has terminals that correspond to the read terminals 25 and are connected to a read element.

The write element is, for example, a standard inductive magnetic transducer. The read element is a high sensitivity read element such as an MR element, a GMR element, or a TuMR element.

[Insulating Layer]

Figure 2:
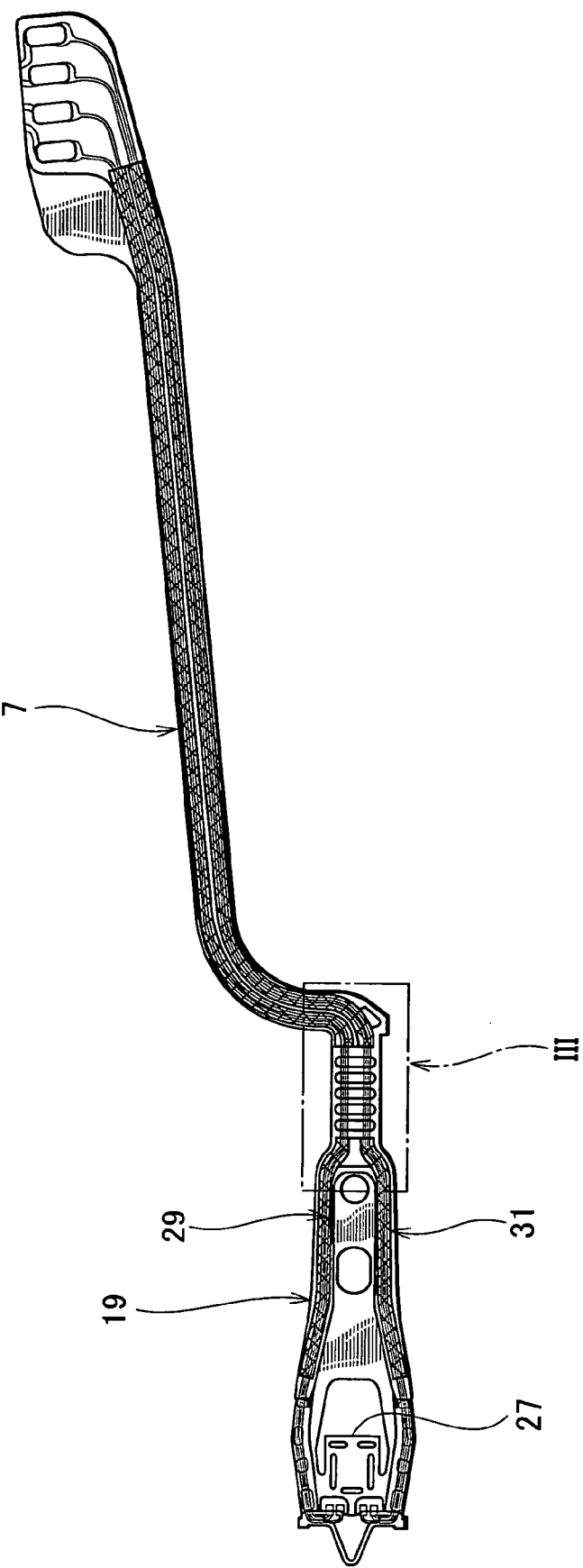
FIG. 2 is a plan view showing a flexure of the head suspension according to the first embodiment.
Figure 3:
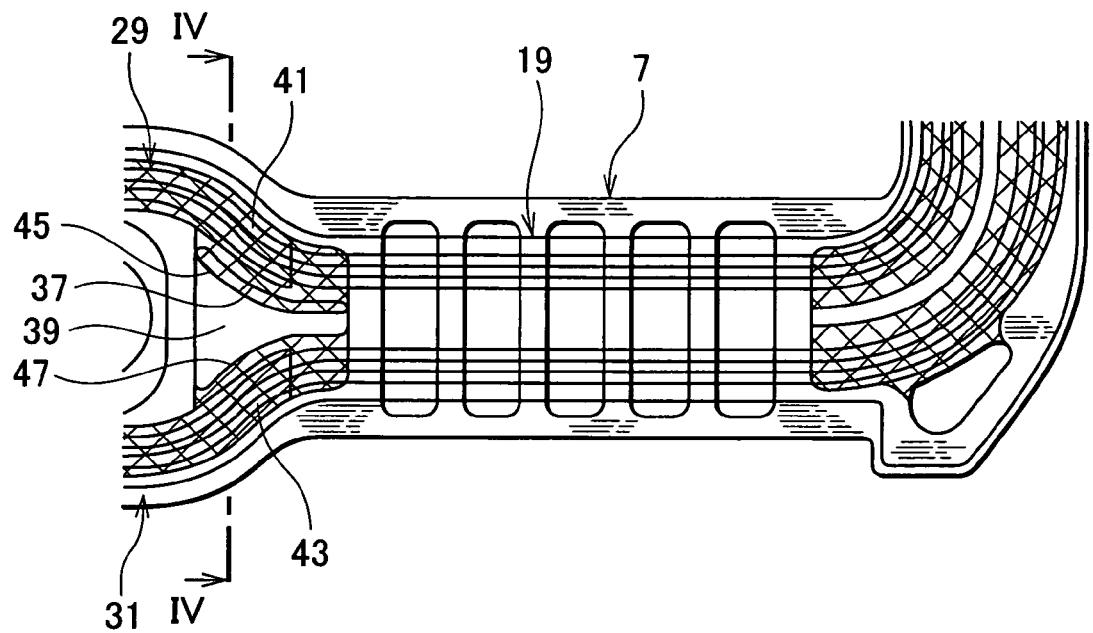
FIG. 3 is an enlarged plan view showing a part III of FIG. 2.
Figure 4:
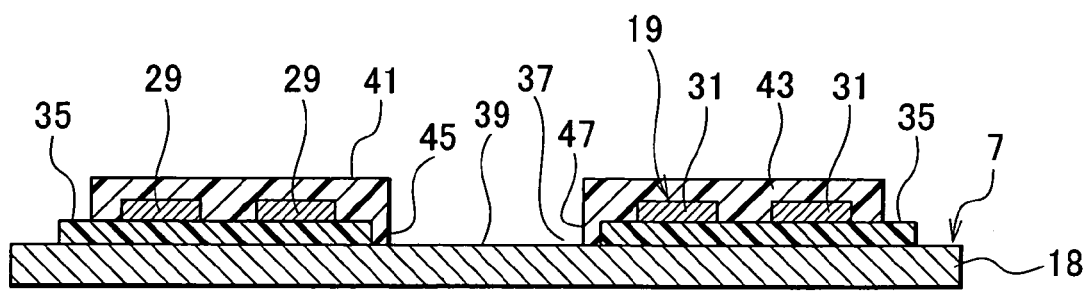
FIG. 4 is a sectional view taken along a line IV-IV of FIG. 3.

FIG. 2 is a plan view showing the flexure 7 having the wiring patterns 19, FIG. 3 is an enlarged plan view showing a part III of FIG. 2, and FIG. 4 is a sectional view taken along a line IV-IV of FIG. 3.

In FIGS. 2 to 4, the wiring patterns 19 include write wires (Write1, Write2) 29 and read wires (Read1, Read2) 31. The write wires 29 and read wires 31 are formed on an insulating base layer 35, which is made of flexible resin and is formed on the substrate 18 of the flexure 7.

The flexible resin of the insulating base layer 35 is polyimide and has a layer thickness of about 10 µm and a surface resistivity of about $10^{14}$ Ω/sq. With this high resistivity, the base layer 35 provides an appropriate insulating capability. The base layer 35 has a hole 37 at a proper location, to partly expose the surface 39 of the flexure 7 through the hole 37.

The write wires 29 and read wires 31 on the insulating base layer 35 are substantially covered with insulating cover layers 41 and 43, respectively. The cover layers 41 and 43 are made of slightly conductive flexible resin and have a layer thickness of about 20 µm in a raising direction from the insulating base layer 35. The cover layer 41 covers the surfaces of the write wires 29 and the cover layer 43 covers the surfaces of the read wires 31, to insulate and protect the wires 29 and 31. The cover layers 41 and 43 have a surface resistivity in the range of $10^4$ to $10^{11}$ Ω/sq. With this resistivity, the cover layers 41 and 43 are sufficiently insulative in terms of circuit operation and are adequately conductive with respect to static electricity.

The insulating cover layers 41 and 43 have extensions 45 and 47, respectively. The extensions 45 and 47 are grounded in the hole 37 to the surface 39 of the substrate 18 of the flexure 7.

[Manufacturing Processes]

FIGS. 5A to 5E are sectional views showing manufacturing processes of the head suspension according to the first embodiment. FIGS. 5A to 5E show only a part around the read wires 31 for the sake of simplicity of explanation. In practice, the manufacturing processes progress on the write wires 29 side, too.

Figure 5A:
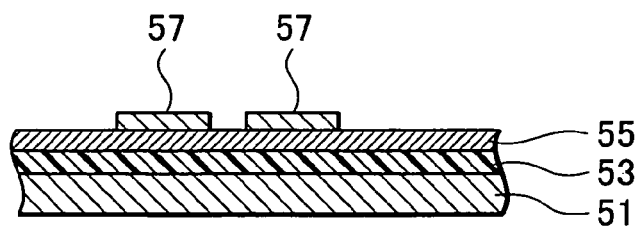
FIGS. 5A to 5E are sectional views showing manufacturing processes of the head suspension according to the first embodiment.

In FIG. 5A, a stainless-steel rolled plate 51 having a thickness in the range of 15 to 30 µm is prepared as the substrate 18. The plate 51 is entirely coated with a polyimide insulating film 53 having a thickness in the range of 5 to 20 µm and serving as the insulating base layer 35. On the film 53, a Cu film 55 of about 5 to 20 µm thick is formed to serve as the wires 31 (29). A resist 57 is formed on the Cu film 55 at a location where a wire (29, 31) is formed.

Figure 5B:
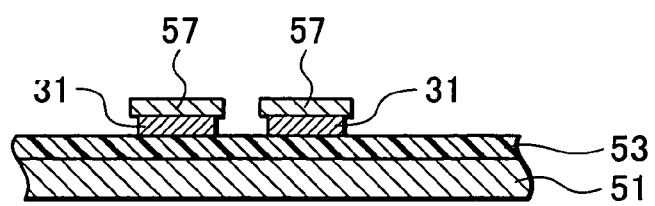

In FIG. 5B, the resist 57 is used as a mask and the Cu film 55 is etched to form the wires 31 (29). The resist 57 is removed with the use of, for example, an organic solvent.

Figure 5C:
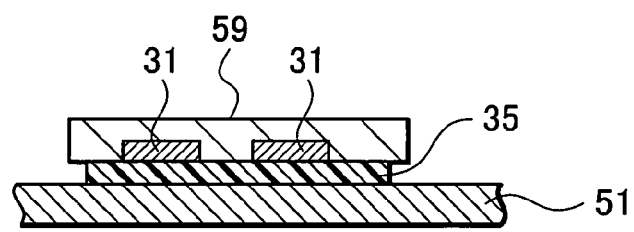

In FIG. 5C, a resist 59 is formed over the wires 31 (29) and polyimide insulating film 53. The resist 59 is used as a mask and the film 53 is etched off with the use of, for example, hydrazine, to form the polyimide insulating base layer 35. The resist 59 is removed with the use of, for example, an organic solvent.

Figure 5D:
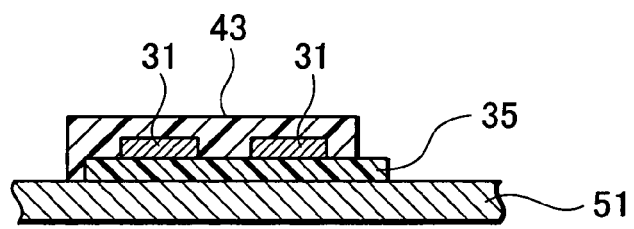

In FIG. 5D, conductive flexible resin such as photosensitive polyimide is entirely applied, exposed, and developed, to form the insulating cover layer 43 (41) covering the wires 31 (29). The conductive flexible resin to form the cover layer 43 (41) may be non-photosensitive polyimide. This, however, requires entirely applying the non-photosensitive polyimide, forming a resist mask on the polyimide layer, etching the polyimide layer, and removing the resist. These additional processes may be omitted by employing the above-mentioned photosensitive polyimide.

Figure 5E:
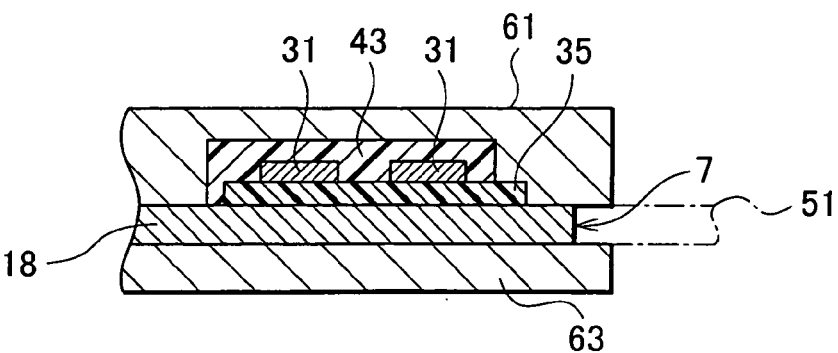

In FIG. 5E, resist patterns 61 and 63 serving as masks are formed on both faces of the stainless-steel rolled plate 51. With these masks, the plate 51 is etched to shape the flexure 7.

The resist patterns 61 and 63 are removed with the use of, for example, an organic solvent. The flexure 7 is welded to the load beam 3, the base plate 15 is welded to the load beam 3, and the load beam 3 is processed by bending and the like, thereby completing the head suspension of FIG. 1.

[Electrostatic Discharge]

During an assembling work of the flexure 7, the surfaces of the insulating cover layers 41 and 43 may be rubbed with another part such as a clamp or a tool, to accumulate static electricity in the cover layers 41 and 43 and wires 29 and 31. The static electricity in the cover layers 41 and 43 and wires 29 and 31 is discharged from the extensions 45 and 47 of the cover layers 41 and 43 to the surface 39 of the flexure 7 in the hole 37. Thereafter, the static electricity is discharged to a tool or jig that is in contact with the substrate 18 of the flexure 7.

Static electricity accumulated in the write wires 29 and read wires 31 through the insulating cover layers 41 and 43 is also discharged to the surface 39 of the flexure 7 in the hole 37 because the wires 29 and 31 are in contact with the cover layers 41 and 43. Thereafter, the static electricity is discharged to a tool or jig that is in contact with the substrate 18 of the flexure 7.

Even if the sliders on the head 21 touch a device, tool, or jig during the assembling work, no static electricity is discharged from the wires 29 and 31 to the sliders. Namely, no damage will occur on the read element due to static electricity. As a result, it is possible to employ, as the read element, a highly sensitive element such as an MR element, a GMR element, or a TuMR element.

The layer structure of the embodiment is basically the same as a conventional layer structure having an insulating cover layer, and therefore, is manufacturable without increasing the number of processes more than the conventional structure. Namely, the head suspension according to the embodiment involves no cost increase compared with the conventional structure.

According to the embodiment, the head suspension 1 itself serves as a static electricity remover, to remove static electricity without using an ionizer. The embodiment, therefore, can reduce a facility cost and the number of manufacturing processes, thereby lowering the total cost of the head suspension.

Second Embodiment

Figure 6:
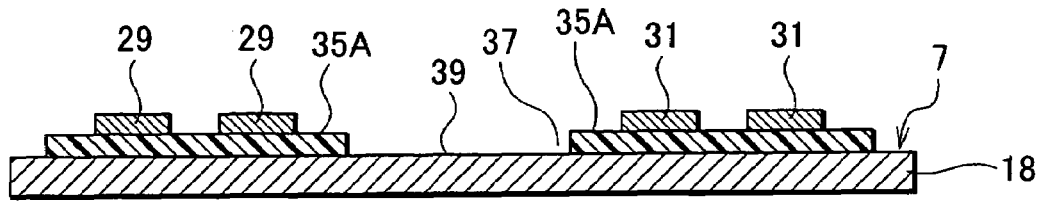
FIG. 6 is a sectional view showing a head suspension according to a second embodiment of the present invention, taken at the same location as FIG. 4.

FIG. 6 is a sectional view showing a head suspension according to a second embodiment of the present invention, taken at a location corresponding to the location along the line IV-IV of FIG. 3. The structure of the second embodiment is basically the same as that of the first embodiment of FIG. 4, and therefore, the same or corresponding parts are represented with the same reference numerals or the same reference numerals plus "A" in FIG. 6.

The second embodiment omits the insulating cover layers 41 and 43 of FIG. 4 and employs an insulating base layer 35A made of slightly conductive flexible resin having a surface resistivity in the range of $10^4$ to $10^{11}$ Ω/sq instead of the insulating base layer 35 of FIG. 4.

To manufacture the head suspension according to the second embodiment, the process of FIG. 5A employs slightly conductive flexible resin to form a polyimide insulating film 53. The film 53 has a thickness in the range of 5 to 20 μm and serves as the insulating base layer 35A.

The second embodiment reduces the number of manufacturing processes by omitting the process of forming the insulating cover layers 41 and 43 of FIG. 5D.

According to the second embodiment, static electricity accumulated in wires 29 and 31 is discharged through the insulating base layer 35A to a substrate 18 of a flexure 7, thereby achieving the same effect as the first embodiment.

Third Embodiment

Figure 7:
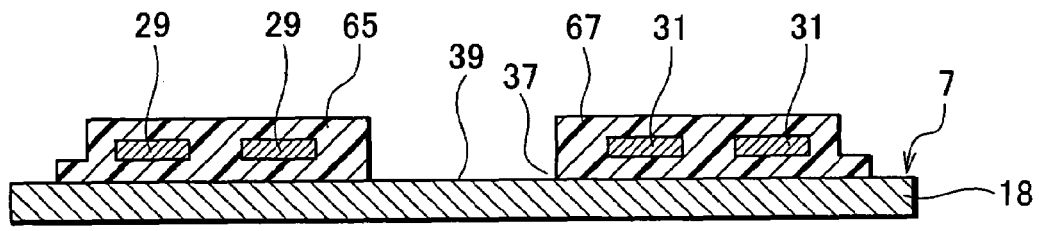
FIG. 7 is a sectional view showing a head suspension according to a third embodiment of the present invention, taken at the same location as FIG. 4.

FIG. 7 is a sectional view showing a head suspension according to a third embodiment of the present invention, taken at a location corresponding to the location along the line IV-IV of FIG. 3. The structure of the third embodiment is basically the same as that of the first embodiment of FIG. 4, and therefore, the same parts are represented with the same reference numerals in FIG. 7.

Instead of the separate insulating base layer 35 and insulating cover layers 41 and 43 of the first embodiment of FIG. 4, the third embodiment of FIG. 7 employs insulating base/cover layers 65 and 67. Each of the layers 65 and 67 is an integration of insulating base and cover layers and is made of slightly conductive flexible resin having a surface resistivity in the range of $10^4$ to $10^{11}$ Ω/sq.

To manufacture the head suspension according to the third embodiment, the process of FIG. 5A employs slightly conductive flexible resin to form a polyimide insulating film 53. The film 53 has a thickness in the range of 5 to 10 μm and serves as an insulating base layer. The process of FIG. 5D employs the slightly conductive flexible resin to form an insulating cover layer, thereby completing the insulating base/cover layers 65 and 67.

The third embodiment can reduce the number of materials to form the insulating base/cover layers 65 and 67 corresponding to the insulating base layer 35 and insulating cover layers 41 and 43 of the first embodiment. This results in reducing the cost of the head suspension.

According to the third embodiment, static electricity accumulated in wires 29 and 31 is discharged through the insulating base/cover layers 65 and 67 to a substrate 18 of a flexure 7, thereby achieving the same effect as the first embodiment.

Fourth Embodiment

Figure 8:
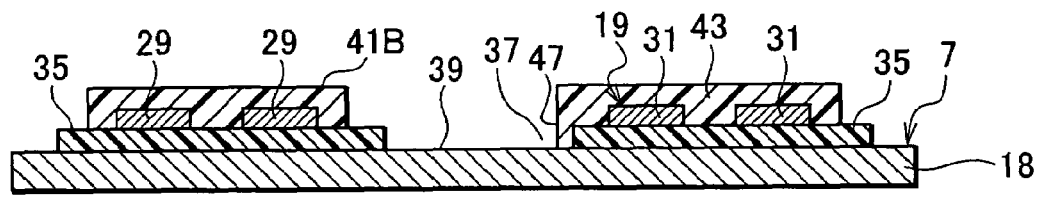
FIG. 8 is a sectional view showing a head suspension according to a fourth embodiment of the present invention, taken at the same location as FIG. 4.

FIG. 8 is a sectional view showing a head suspension according to a fourth embodiment of the present invention, taken at a location corresponding to the location along the line IV-IV of FIG. 3. The structure of the fourth embodiment is basically the same as that of the first embodiment of FIG. 4, and therefore, the same or corresponding parts are represented with the same reference numerals or the same reference numerals plus "B" in FIG. 8.

Instead of the insulating cover layer 41 on the write side of the first embodiment, the fourth embodiment employs an insulating cover layer 41B having a surface resistivity of about $10^{14}$ Ω/sq.

According to the fourth embodiment, the insulating cover layer 41B is not slightly conductive. Namely, the fourth embodiment causes no deterioration in the high frequency components of write signals due to slightly conductive material.

According to the fourth embodiment, static electricity accumulated in read wires 31 is discharged to a substrate 18 of a flexure 7 like the first embodiment.

Fifth Embodiment

Figure 9:
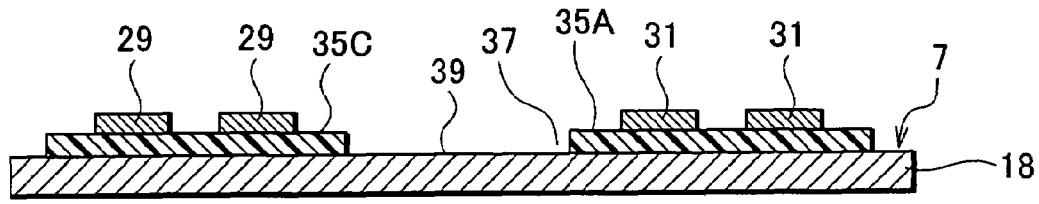
FIG. 9 is a sectional view showing a head suspension according to a fifth embodiment of the present invention, taken at the same location as FIG. 4.

FIG. 9 is a sectional view showing a head suspension according to a fifth embodiment of the present invention, taken at a location corresponding to the location along the line IV-IV of FIG. 3. The structure of the fifth embodiment is basically the same as that of the second embodiment of FIG. 6, and therefore, the same or corresponding parts are represented with the same reference numerals or the same reference numerals plus "C" in FIG. 9 instead of "A" of FIG. 6.

Instead of the insulating base layer 35A on the write side of the second embodiment of FIG. 6, the fifth embodiment employs an insulating base layer 35C having a surface resistivity of about $10^{14}$ Ω/sq like the first embodiment.

According to the fifth embodiment, the insulating base layer 35C is not slightly conductive. Namely, the fifth embodiment causes no deterioration in the high frequency components of write signals due to slightly conductive material.

According to the fifth embodiment, static electricity accumulated in read wires 31 is discharged to a substrate 18 of a flexure 7 like the second embodiment.

Sixth Embodiment

Figure 10:
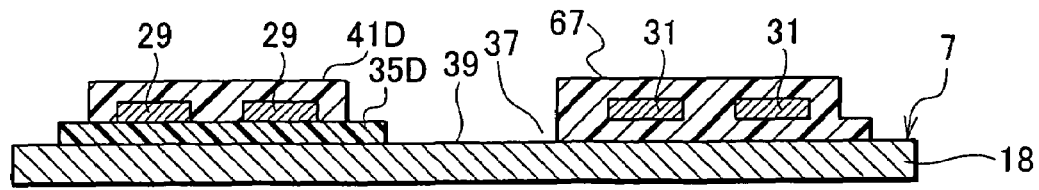
FIG. 10 is a sectional view showing a head suspension according to a sixth embodiment of the present invention, taken at the same location as FIG. 4.

FIG. 10 is a sectional view showing a head suspension according to a sixth embodiment of the present invention, taken at a location corresponding to the location along the line IV-IV of FIG. 3. The structure of the sixth embodiment is basically the same as that of the third embodiment of FIG. 7, and therefore, the same or corresponding parts are represented with the same reference numerals or the same reference numerals plus "D" in FIG. 10.

Instead of the insulating base/cover layer 65 on the write side of the third embodiment of FIG. 7, the sixth embodiment employs an insulating base layer 35D having a surface resistivity of about $10^{14}$ Ω/sq and an insulating cover layer 41D having a surface resistivity of about $10^{14}$ Ω/sq.

According to the sixth embodiment, the insulating base layer 35D and cover layer 41D are not slightly conductive. Namely, the sixth embodiment causes no deterioration in the high frequency components of write signals due to slightly conductive material.

According to the sixth embodiment, static electricity accumulated in read wires 31 is discharged to a substrate 18 of a flexure 7 like the third embodiment.

Seventh Embodiment

Figure 11:
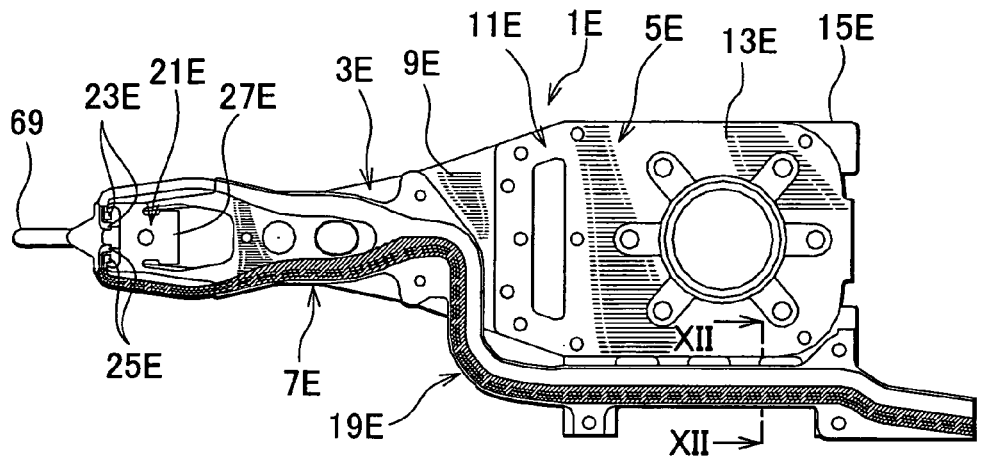
FIG. 11 is a plan view showing a head suspension according to a seventh embodiment of the present invention.
Figure 12:
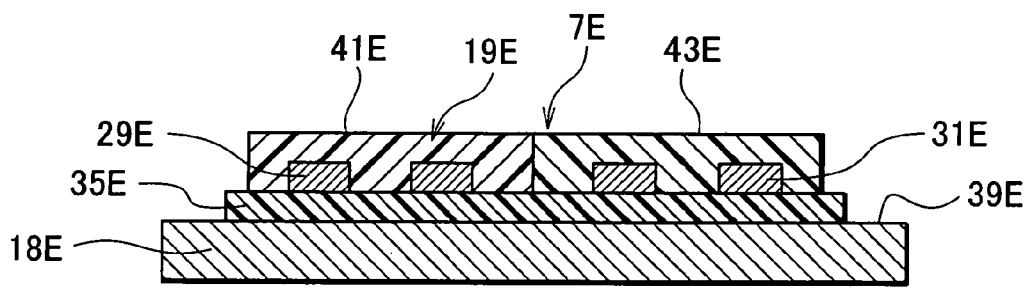
FIG. 12 is a sectional view taken along a line XII-XII of FIG. 11.

FIG. 11 is a plan view showing a head suspension according to a seventh embodiment of the present invention and FIG. 12 is a sectional view taken along a line XII-XII of FIG. 11. The structure of the seventh embodiment is basically the same as that of the first embodiment, and therefore, parts corresponding to those of the first embodiment are represented with the same reference numerals plus "E" in FIGS. 11 and 12.

In FIG. 11, the head suspension 1E has a load/unload tab 69. A flexure 7E is arranged along a side of a load beam 3E and is extended from a head 21E to a base 5E.

In FIGS. 11 and 12, wiring patterns 19E include write wires (Write1, Write2) 29E and read wires (Read1, Read2) 31E. The write wires 29E and read wires 31E are arranged adjacent to each other on an insulating base layer 35E, which is formed on a substrate 18E of the flexure 7E. The base layer 35E has a surface resistivity of about $10^{14}$ Ω/sq. With this high resistivity, the base layer 35E realizes a high insulating ability.

The write wires 29E on the base layer 35E are covered with an insulating cover layer 41E. The read wires 31E on the base layer 35E are covered with an insulating cover layer 43E. The cover layers 41E and 43E are adjacent to each other and have a layer thickness of about 20 μm in a raising direction from the base layer 35E. The cover layer 41E covers and protects the write wires 29E from external force and the like. The cover layer 43E covers and protects the read wires 31E from external force and the like.

The insulating cover layer 41E on the write side has a surface resistivity of about $10^{14}$ Ω/sq to achieve a high insulating ability. The insulating cover layer 43E on the read side is made of slightly conductive flexible resin and has a surface resistivity in the range of $10^4$ to $10^{11}$ Ω/sq. With this resistivity, the cover layer 43E is sufficiently insulative in terms of circuit operation and is adequately conductive with respect to static electricity.

The seventh embodiment is effective to protect a slider of the head 21E from electrostatic discharge damage.

When the flexure 7E is assembled into the head suspension, the insulating cover layer 43E may be rubbed with another part such as a clamp or a tool or the like, to accumulate static electricity. This static electricity is discharged when the cover layer 43E comes in contact with a conductive jig or the like. The static electricity is also discharged from edges of the cover layer 43E to the atmosphere. Although discharge part of the cover layer 43E is limited, static electricity can move through the cover layer 43E and can be easily discharged therefrom.

In this way, the insulating cover layer 43E made of slightly conductive flexible resin can discharge static electricity, so that no static electricity moves from the wires 29E and 31E to the sliders of the head 21E even if the sliders come in contact with devices, tools, jigs, and the like. This protects a read element installed on the head 21E from electrostatic discharge damage and the like. The read element, therefore, may be a highly sensitive element such as an MR element, a GMR element, or a TuMR element.

The insulating cover layer 41E on the write wires 29E is not slightly conductive, and therefore, causes no deterioration in the high frequency components of write signals due to slightly conductive material.

Figure 13:
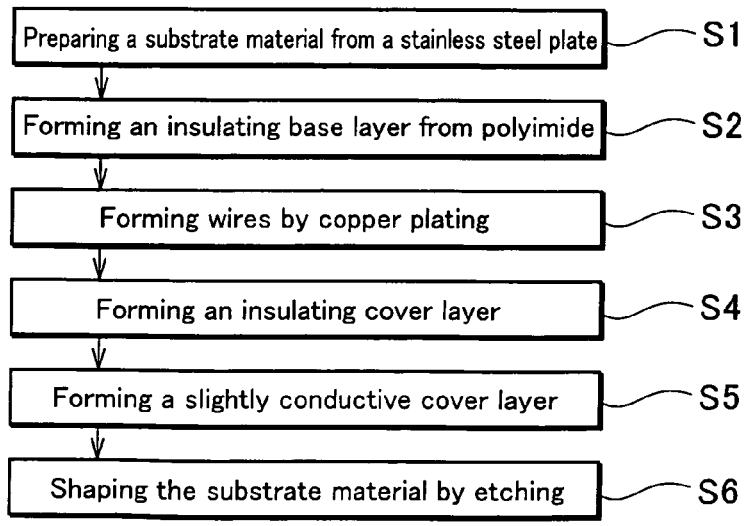
FIG. 13 is a flowchart showing an additive manufacturing method of a flexure of the head suspension according to the seventh embodiment.
Figure 14:
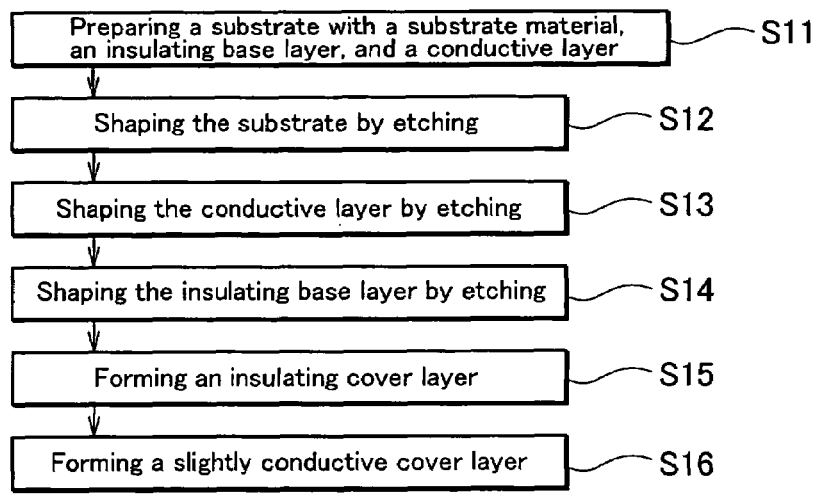
FIG. 14 is a flowchart showing a subtractive manufacturing method of a flexure of the head suspension according to the seventh embodiment.
Figure 15:
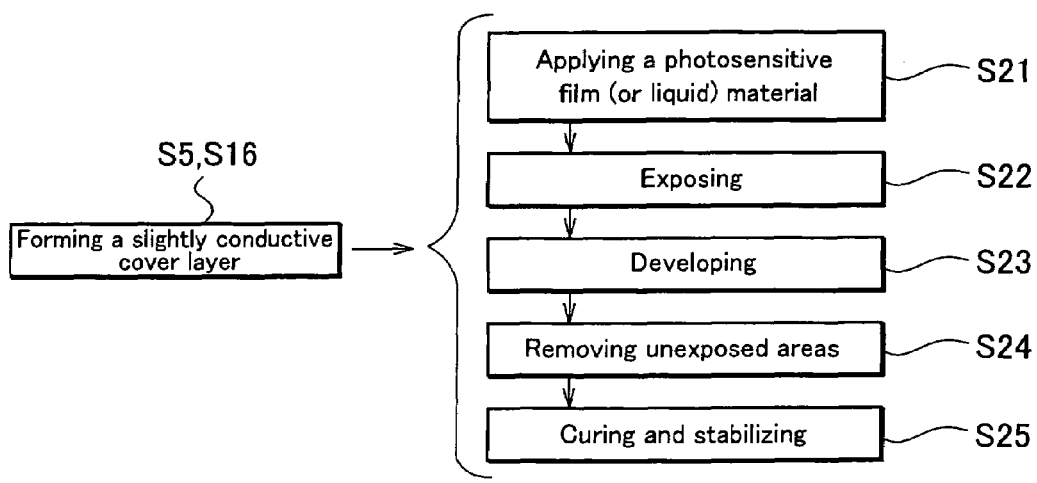
FIG. 15 is a flowchart showing manufacturing processes of an insulating cover layer of the head suspension according to the seventh embodiment.

FIG. 13 is a flowchart showing an additive manufacturing method of the flexure 7E of the head suspension 1E according to the seventh embodiment, FIG. 14 is a flowchart showing a subtractive manufacturing method of the flexure 7E, and FIG. 15 is a flowchart showing manufacturing processes of the insulating cover layer 43E.

According to the additive method of FIG. 13, step S1 prepares a conductive thin plate made of, for example, stainless steel. The thin plate serves as the substrate 18E.

Step S2 forms the insulating base layer 35E from, for example, polyimide on the conductive thin plate.

Step S3 forms the wires 29E and 31E by, for example, copper plating on the base insulating layer 35E.

Step S4 forms the insulating cover layer 41E on the write side like FIG. 5D.

Step S5 forms the slightly conductive cover layer 43E on the read side. The details of this process will be explained later.

Step S6 shapes the conductive thin plate by, for example, etching into the substrate 18E.

According to the subtractive method of FIG. 14, step S11 prepares a conductive thin plate serving as the substrate 18E. On the conductive thin plate, a base insulating material serving as the base insulating layer 35E is formed. On the base insulating material, a conductive layer serving as the wires 29E and 31E is formed.

Step S12 shapes the conductive thin plate by, for example, etching into the substrate 18E.

Step S13 patterns the conductive layer by, for example, etching into the wires 29E and 31E.

Step S14 etches the insulating base material into the insulating base layer 35E.

Step S15 forms the insulating cover layer 41E on the write side like FIG. 5D.

Step S16 forms the slightly conductive cover layer 43E on the read side. The details of this process will be explained later.

FIG. 15 shows the details of the process of forming the slightly conductive cover layer 43E carried out in steps S5 and S16.

Step S21 attaches a photosensitive film material over the wires 31E and insulating base layer 35E. Instead of the photosensitive film material, photosensitive liquid material may be employed.

Step S22 exposes predetermined locations of the photosensitive film (or liquid) material. Step S23 develops the photosensitive film (or liquid) material.

Step S24 removes unexposed areas that have not bee exposed in step S22. Step S25 stabilizes the photosensitive film (or liquid) material and completes the cover layer 43E.

Eighth Embodiment

Figure 16:
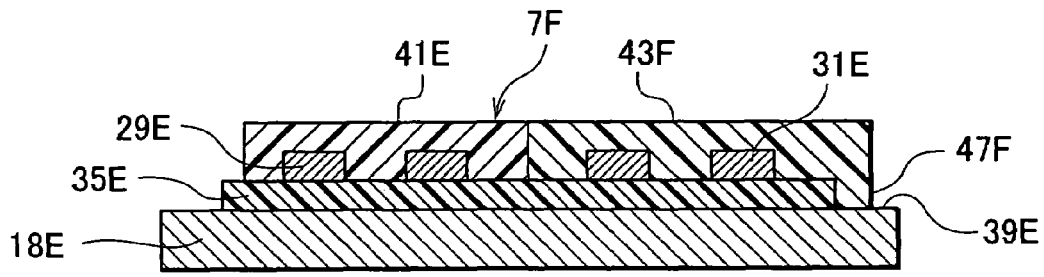
FIG. 16 is a sectional view showing a head suspension according to an eighth embodiment of the present invention, taken at the same location as FIG. 12.

FIG. 16 is a sectional view showing a head suspension according to an eighth embodiment of the present invention, taken at a location corresponding to the location along the line XII-XII of FIG. 11. The structure of the eighth embodiment is basically the same as that of the seventh embodiment, and therefore, the same or corresponding parts are represented with the same reference numerals or the same reference numerals plus "F" in FIG. 16 instead of "E" of FIGS. 11 and 12.

Instead of the insulating cover layer 43E on the read side of the seventh embodiment, the eighth embodiment employs an insulating cover layer 43F having an extension 47F. The extension 47F is grounded to a surface 39E of a substrate 18E of a flexure 7F.

According to the eighth embodiment, static electricity accumulated in the insulating cover layer 43F and wires 31F is discharged through the extension 47F to the surface 39E of the substrate 18E of the flexure 7F. From there, the static electricity is discharged to a tool or the like that is in contact with the substrate 18E of the flexure 7F.

Accordingly, the eighth embodiment can provide the same effect as any other embodiment.

Ninth Embodiment

Figure 17:
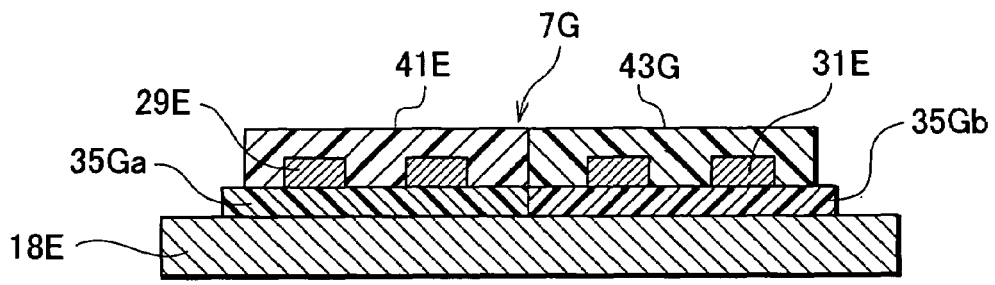
FIG. 17 is a sectional view showing a head suspension according to a ninth embodiment of the present invention, taken at the same location as FIG. 12.

FIG. 17 is a sectional view showing a head suspension according to a ninth embodiment of the present invention, taken at a location corresponding to the location along the line XII-XII of FIG. 11. The structure of the ninth embodiment is basically the same as that of the seventh embodiment, and therefore, the same or corresponding parts are represented with the same reference numerals or the same reference numerals plus "G" in FIG. 17 instead of "E" of FIGS. 11 and 12.

The ninth embodiment divides the insulating base layer 35E of the seventh embodiment into an insulating base layer 35Ga on the write side and an insulating base layer 35Gb on the read side. The base layer 35Ga on the write side is made of highly resistive resin having a surface resistivity of about $10^{14}$ $\Omega$/sq like the base layer 35E. The base layer 35Gb on the read side is made of slightly conductive flexible resin having a surface resistivity in the range of $10^4$ to $10^{11}$ $\Omega$/sq like a cover layer 43G.

Accordingly, the ninth embodiment can provide the same effect as the sixth embodiment.

Tenth Embodiment

Figure 18:
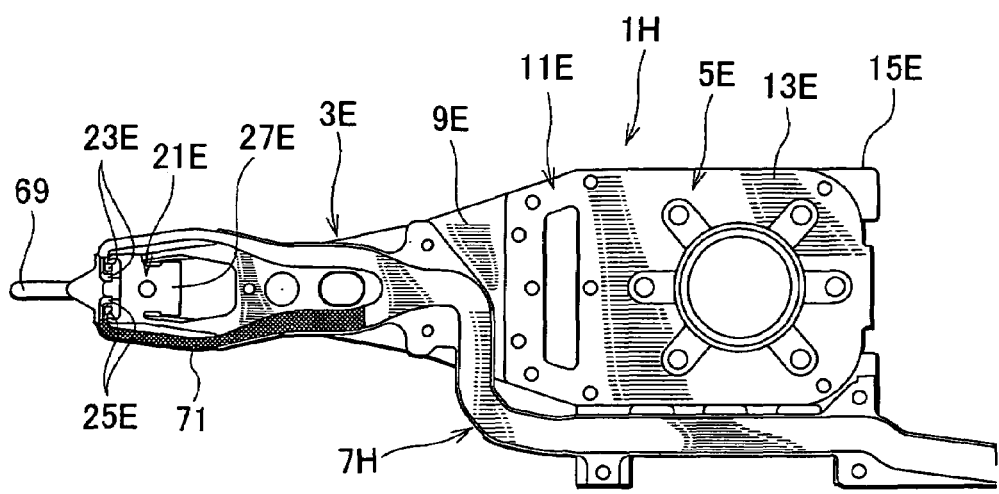
FIG. 18 is a plan view showing a head suspension according to a tenth embodiment of the present invention.

FIG. 18 is a plan view showing a head suspension according to a tenth embodiment of the present invention. The structure of the tenth embodiment is basically the same as the seventh embodiment of FIG. 11, and therefore, the same or corresponding parts are represented with the same reference numerals or the same reference numerals plus "H" in FIG. 18 instead of "E" of FIG. 11.

The head suspension 1H according to the tenth embodiment has the electrostatic discharge damage preventive structure of any one of FIGS. 12, 16, and 17 only along a part 71 of a head 21E.

Providing the electrostatic discharge damage preventive structure only for the part 71 of the head 21E is also effective to prevent electrostatic discharge through sliders arranged on the head 21E.

The electrostatic discharge damage preventive structure may be provided for part of a flexure that is proximal to or distal from the head 21E.

What is claimed is:

1. A head suspension comprising:
   a load beam configured to apply load to a head ha writes and reads data to and from a hard disk;
   a flexure made of a conductive chin plate substrate attached to the load beam and configured to support the head;
   base layers made of flexible resin and formed on the plate substrate of the flexure;
   write wires and read wires having first ends connected to the head and second ends distal to the head and located at the load beam, the write wires and the read wires from the first ends to the second ends being formed on the base layers, said base layers having sufficient insulating characteristics between the write wires and the conductive thin plate substrate of the flexure and also the read wires and the conductive thin plate substrate of the flexure so as to permit functional transmission of read and write signal from and to the head;
   the base layers including a write-wire-side base layer and a read-wire-side base layer disposed apart from each other, the write-wire-side base layer being disposed between the write wires and the conductive thin plate substrate of the flexure and the read-wire-side base layer disposed between the read wires and the conductive thin plate substrate of the flexure; and
   at least a portion of the read-wire-side base layer of the flexible resin of the base layers at least at a position between the first ends and the second ends, being a slightly conductive flexible resin at least between the read wires and the flexure so as to discharge static electricity from at least the read wires to the conductive thin plate substrate of the flexure.

2. The head suspension of claim 1, wherein the slightly conductive flexible resin has a surface resistivity in the range of $10^4$ to $10^{11}$ $\Omega$/sq.

3. The head suspension of claim 1 wherein portions of the base layers contacting the write wires have a surface resistivity of about $10^{14}$ $\Omega$/sq which is greater than a surface resistivity of the part of the base layers made of slightly conductive flexible resin.

4. The head suspension of claim 1, further comprising:
   a cover layer formed of flexible resin covering the write and read wires on the base layers,
   a portion of the flexible resin of the cover layer at least on the read wires being slightly conductive flexible resin.

5. The head suspension of claim 4, wherein the slightly conductive flexible resin of the base layers and the cover layer has a surface resistivity in the range of $10^4$ to $10^{11}$ $\Omega$/sq.

6. The head suspension of claim 5 wherein portions of the cover layer contacting the write wires and portions of the base layers contacting the write wires have a surface resistivity of about $10^{14}$ $\Omega$/sq which is greater than a surface resistivity of the part of the base layers made of slightly conductive flexible resin.

7. The head suspension of claim 4 wherein portions of the cover layer contacting the write wires and portions of the base layers contacting the write wires have a surface resistivity of about $10^{14}$ $\Omega$/sq which is greater than a surface resistivity of the part of the base layers made of slightly conductive flexible resin.

8. A head Suspension, comprising:
a load beam configured to apply load to a head that writes and reads data to and from a hard disk;
a flexure made of a conductive thin substrate attached to the load beam and configured to support the bead;
a base layer made of flexible resin and formed on the substrate of the flexure;
write wires and read wires having first ends connected to the head and second ends distal to the head and located at the load beam, the write wires and the read wires from the first ends to the second ends being formed on the base layer, said base layer having sufficient insulating characteristics between the write wires and the flexure and also the read wires and the flexure so as to permit functional transmission of read and write signal from and to the head;
a cover layer covering and contacting the write and read wires on the base layer;
the cover layer having first cover layer portions on the read wires, said first cover layer portions being made of a material that is a slightly conductive flexible resin in contact with the read wires so as in discharge static electricity from the read wires;
the cover layer having second cover layer portions in contact with the write wires which are absent the slightly conductive flexible resin and are formed of insulating resin, the second cover layer portions being laterally adjacent said first cover layer portions; and
the cover layer of said first cover layer portions on the read wires having an integral extension portion of the slightly conductive flexible resin extending and being grounded to a surface of the substrate of the flexure to discharge the static electricity to the flexure.

9. The heart suspension claim 8 wherein portions of the cover layer contracting the Write wires have a surface resistivity of about $10^{14}$ Ω/sq which is greater than a surface resistivity of the part of the cover layer made of slightly conductive flexible resin.

10. The head suspension of claim 8, wherein the slightly conductive flexible resin has a surface resistivity in the range of $10^{14}$ to $10^{11}$ Ω/sq.

11. The head suspension of claim 10 wherein portions of the cover layer contacting the write wires have a surface resistivity of about $10^{14}$ Ω/sq.

12. The head suspension claim 8 wherein the cover layer includes a protruding portion protruding from an edge of the base layer in a width direction so as to oppose the surface of the substrate or the flexure in a thickness direction, and the extension is formed between the protruding portion and the surface of the substrate of the flexure in the thickness direction.

13. The head suspension claim 12 wherein the base layer has a hole to partly expose the surface of the substrate of the flexure between the read arid write wires in the width direction, and the extension is disposed in the hole.

14. A head suspension. comprising:
a load beam configured to apply Load to a head that writes and reads data to and from a hard disk;
a flexure made of a conductive thin substrate attached to the load beam and configured to support the head;
a base layer made of flexible resin and formed on the substrate of the flexure;
write wires and read wires having first ends connected to the head and second ends distal to the head and located at the load beam, the write wires and the read wires from the first ends to the second ends being formed on the base layer, said base layer having sufficient insulating characteristics between the write wires and the flexure and also the read wires and the flexure so as to permit functional transmission of read and write signal horn and to the head; and
at least a portion of the flexible resin of the base layer at least at a position between the first ends and the second ends, being a slightly conductive flexible resin at least between the read wires and the flexure so as to discharge static electricity from at least the read wires to die flexure,
wherein portions of the base layer contacting die write wires have a surface resistivity of about $10^{14}$ Ω/sq which is greater than a surface resistivity of the part of the base layer made of slightly conductive flexible resin.

* * * * *